US010347761B2

(12) United States Patent
Lin et al.

(10) Patent No.: US 10,347,761 B2
(45) Date of Patent: Jul. 9, 2019

(54) TUNNELING FIELD EFFECT TRANSISTOR AND METHOD FOR FABRICATING THE SAME

(71) Applicant: UNITED MICROELECTRONICS CORP., Hsin-Chu (TW)

(72) Inventors: Chun-Hao Lin, Kaohsiung (TW); Chun-Jung Tang, Tainan (TW); Hsin-Yu Chen, Nantou County (TW); Shou-Wei Hsieh, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/821,860

(22) Filed: Nov. 24, 2017

(65) Prior Publication Data
US 2019/0131453 A1 May 2, 2019

(30) Foreign Application Priority Data

Oct. 27, 2017 (CN) .......................... 2017 1 1026937

(51) Int. Cl.
*H01L 29/78* (2006.01)
*H01L 29/06* (2006.01)
*H01L 29/10* (2006.01)
*H01L 29/423* (2006.01)
*H01L 21/762* (2006.01)
*H01L 29/08* (2006.01)
*H01L 29/66* (2006.01)
(Continued)

(52) U.S. Cl.
CPC .... *H01L 29/7846* (2013.01); *H01L 21/76224* (2013.01); *H01L 29/0653* (2013.01); *H01L 29/0847* (2013.01); *H01L 29/1033* (2013.01); *H01L 29/42356* (2013.01); *H01L 29/7831* (2013.01); *H01L 29/165* (2013.01); *H01L 29/167* (2013.01); *H01L 29/6656* (2013.01); *H01L 29/66484* (2013.01); *H01L 29/66545* (2013.01); *H01L 29/66636* (2013.01); *H01L 29/66795* (2013.01); *H01L 29/7848* (2013.01); *H01L 29/7851* (2013.01)

(58) Field of Classification Search
None
See application file for complete search history.

(56) References Cited

U.S. PATENT DOCUMENTS 9,362,383 B1 * 6/2016 Balakrishnan ...... H01L 29/6653
2016/0322262 A1 * 11/2016 Li ..................... H01L 21/76224
(Continued)

OTHER PUBLICATIONS

Wang, Kuan Ti et al., "Novel SDB TFET FinFET Structure", Invention Disclosure, Aug. 5, 2016, p. 1-23.
(Continued)

*Primary Examiner* — Lex H Malsawma
(74) *Attorney, Agent, or Firm* — Winston Hsu

(57) ABSTRACT

A tunnel field effect transistor (TFET) includes: a first gate structure on a substrate; a source region having a first conductive type on one side of the first gate structure; a drain region having a second conductive type on another side of the first gate structure; a first isolation structure adjacent to the source region; and a second isolation structure adjacent to the drain region. Preferably, the first isolation and the second isolation comprise different material and different depths or same material and different depths.

20 Claims, 3 Drawing Sheets

(51) Int. Cl.
*H01L 29/165* (2006.01)
*H01L 29/167* (2006.01)

(56) References Cited

U.S. PATENT DOCUMENTS

| | | | | |
|---|---|---|---|---|
| 2017/0317166 | A1* | 11/2017 | Pei | H01L 21/3065 |
| 2018/0130711 | A1* | 5/2018 | Zang | H01L 21/823431 |
| 2018/0308959 | A1* | 10/2018 | Afzalian | H01L 29/66977 |
| 2018/0337033 | A1* | 11/2018 | Pandey | H01L 21/823431 |
| 2018/0350904 | A1* | 12/2018 | Nagai | H01L 29/0649 |
| 2019/0006360 | A1* | 1/2019 | Tung | H01L 27/0924 |
| 2019/0035633 | A1* | 1/2019 | Jha | H01L 21/28123 |
| 2019/0058036 | A1* | 2/2019 | Smith | H01L 21/02603 |

OTHER PUBLICATIONS

Hsu, Title of Invention: Complementary Metal Oxide Semiconductor Device and Method of Forming the Same, U.S. Appl. No. 15/446,009, filed Mar. 1, 2017.

* cited by examiner

TUNNELING FIELD EFFECT TRANSISTOR AND METHOD FOR FABRICATING THE SAME

BACKGROUND OF THE INVENTION

1. Field of the Invention

The present invention relates to a tunneling field effect transistor (TFET), and more particularly to a TFET having isolation structures adjacent to two sides of the gate structure.

2. Description of the Prior Art

In the past decades, semiconductor integrated circuit (IC) industry has developed rapidly. The advancement of semiconductor materials and manufacturing technology allows ICs to contentiously shrink with increased complexity and improved performance. More semiconductor devices having smaller feature sizes may be formed within a unit area of a semiconductor substrate to achieve a higher integrity. However, it adversely results in some technological problems. For example, closely arranged semiconductors devices may have larger leakage current and obvious signal interference. Furthermore, power consumption is also a primary concern in advanced technology.

Tunneling field effect transistors (TFETs) have been proposed to take the place of conventional metal-oxide semiconductor field effect transistors (MOSFETs) in some applications confronted with the aforesaid problems. TFETs are advantageous over conventional MOSFETs in the respects of smaller sub-threshold swing (for example, smaller than 60 mV/dec), larger on-off current ratio ($I_{on}/I_{off}$) and smaller off-state leakage current ($I_{off}$).

However, there are still some problems in existing TFETs. For example, the on-state current ($I_{on}$) of a TFET is too low for certain application and the sub-threshold swing of a TFET still need further improvement.

SUMMARY OF THE INVENTION

According to an embodiment of the present invention, a tunnel field effect transistor (TFET) includes: a first gate structure on a substrate; a source region having a first conductive type on one side of the first gate structure; a drain region having a second conductive type on another side of the first gate structure; a first isolation structure adjacent to the source region; and a second isolation structure adjacent to the drain region. Preferably, the first isolation and the second isolation comprise different material and different depths.

According to another embodiment of the present invention, a tunnel field effect transistor (TFET) includes: a first gate structure on a substrate; a source region having a first conductive type on one side of the first gate structure; a drain region having a second conductive type on another side of the first gate structure; a first isolation structure adjacent to the source region; and a second isolation structure adjacent to the drain region. Preferably, the first isolation and the second isolation comprise same material and different depths.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
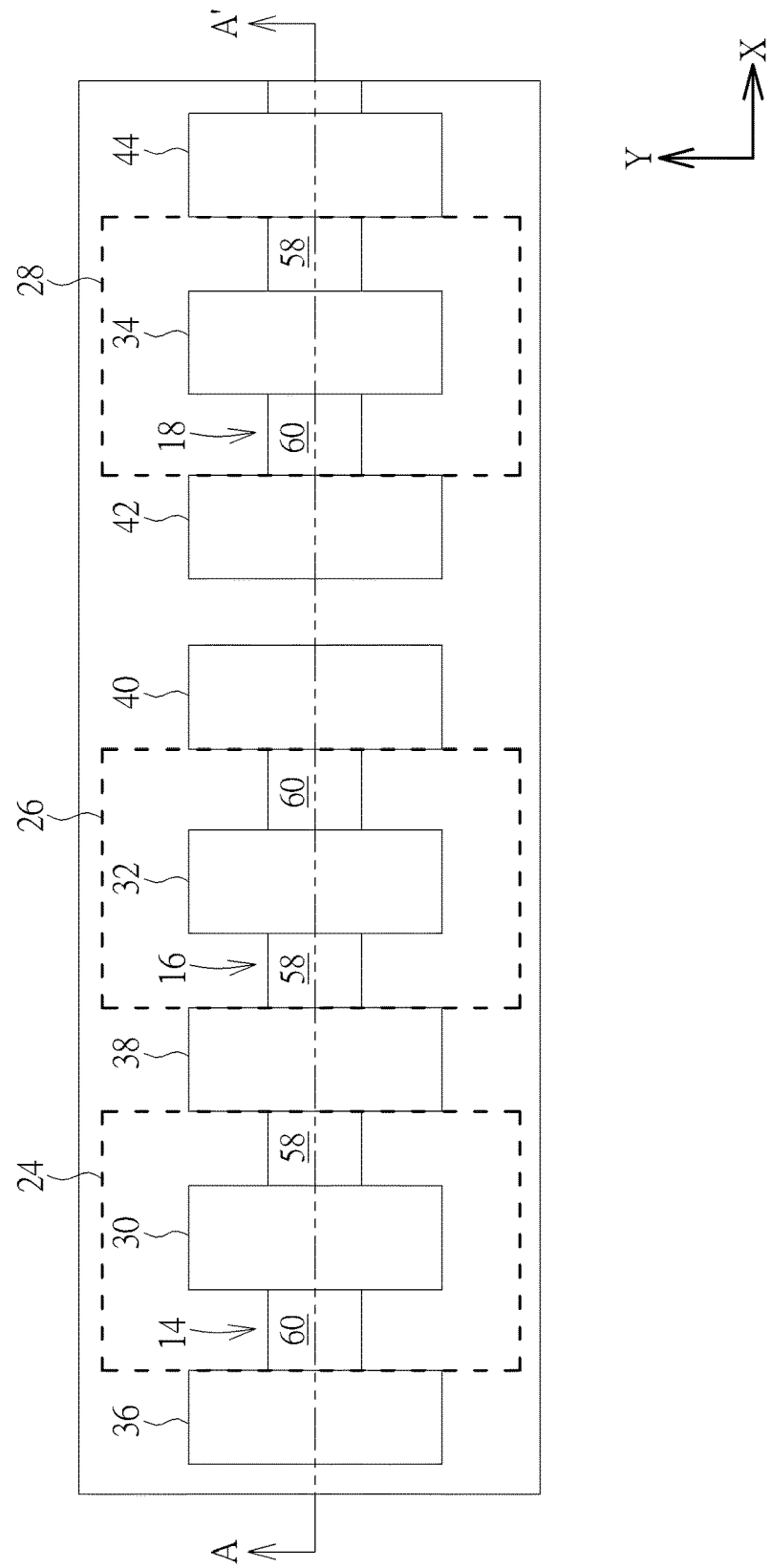
FIG. 1 illustrates structural views of a TFET device according to an embodiment of the present invention.
Figure 2:
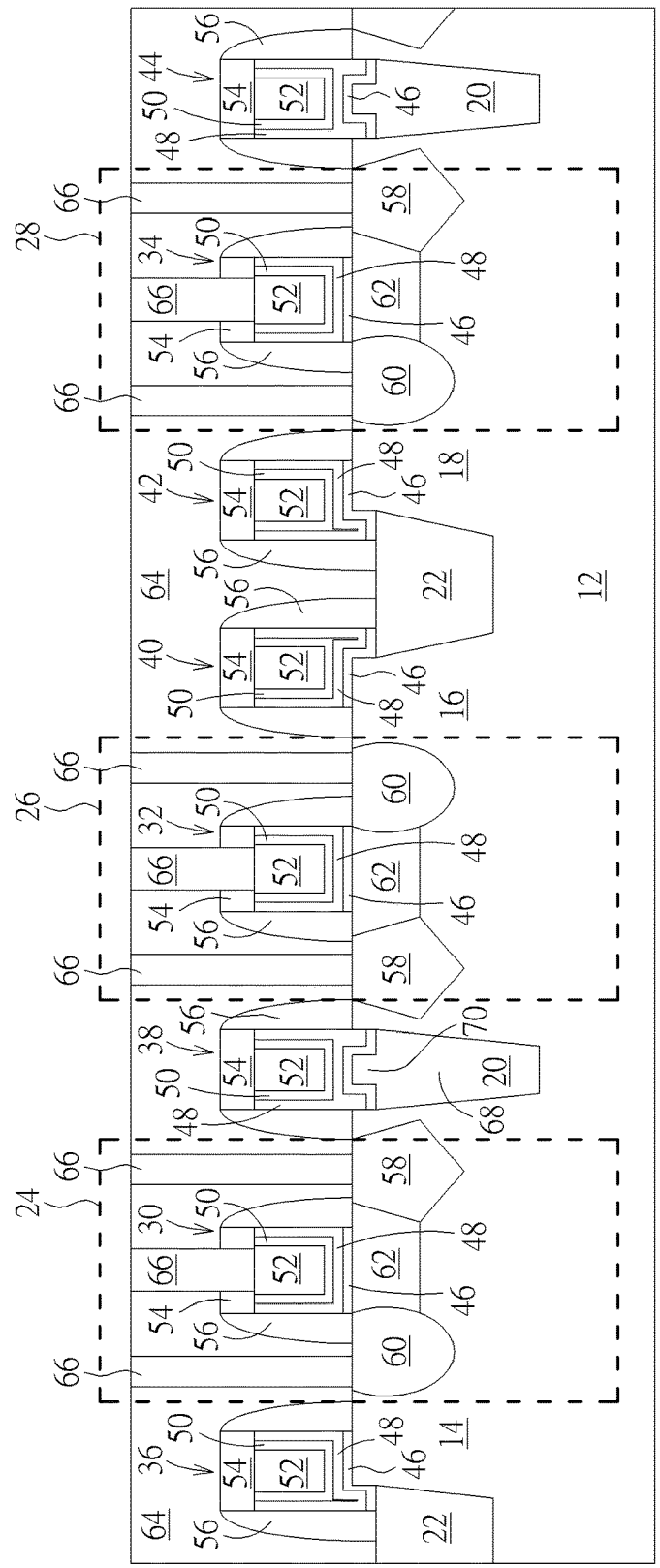
FIG. 2 illustrates a cross-sectional view of FIG. 1 along the sectional line AA'.

Referring to FIGS. 1-2, FIG. 1 illustrates structural views of a TFET device according to an embodiment of the present invention and FIG. 2 illustrates a cross-sectional view of FIG. 1 along the sectional line AA'. As shown in FIGS. 1-2, a substrate 12, such as a silicon substrate or silicon-on-insulator (SOI) substrate is first provided and at least a fin-shaped structure, such as fin-shaped structures 14, 16, 18 are formed on the substrate 12, in which the bottom of the fin-shaped structures 14, 16, 18 is surrounded by an insulating layer, shallow trench isolations (STIs), or isolation structures 20, 22 made of material including but not limited to for example silicon oxide.

According to an embodiment of the present invention, the fin-shaped structures 14, 16, 18 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 14, 16, 18 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structures 14, 16, 18 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, TFETs 24, 26, 28 are formed on the fin-shaped structures 14, 16, 18 and gate structures 36, 38, 40, 42, 44 are formed adjacent to two sides of the TFETs 24, 26, 28, in which the gate structures 30, 32, 34 of the TFETs 24, 26, 28 are active gate structures while gate structures 36, 38, 40, 42, 44 adjacent to two sides of the TFETs 24, 26, 28 are dummy gates. In this embodiment, each of the gate structures 30, 32, 34, 36, 38, 40, 42, 44 is a metal gate and the formation of the gate structures 30, 32, 34, 36, 38, 40, 42, 44 could be accomplished by a gate first process, a high-k first approach from gate last process, or a high-k last approach from gate last process.

Since the formation of the gate structures 30, 32, 34, 36, 38, 40, 42, 44 in this embodiment pertains to a combination of high-k last process and a replacement metal gate (RMG) process, each of the gate structures 30, 32, 34, 36, 38, 40, 42, 44 fabricated through the above processes preferably includes an interfacial layer or gate dielectric layer 46, a U-shaped high-k dielectric layer 48, a U-shaped work function metal layer 50, and a low resistance metal layer 52. A hard mask 54 made of material including but not limited to for example silicon nitride is also formed on each of the gate structures 30, 32, 34, 36, 38, 40, 42, 44. Since the approach of transforming dummy gates made of polysilicon into metal gates through RMG process is well known to those skilled in the art, the details of which are not explained herein for the sake of brevity.

In this embodiment, the high-k dielectric layer 48 is preferably selected from dielectric materials having dielectric constant (k value) larger than 4. For instance, the high-k dielectric layer 48 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 50 is formed for tuning the work function of the metal gate in accordance with the conductivity of the device. According to an embodiment of the present invention, a n-type work function metal layer having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. In addition, a p-type work function metal layer having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 50 and the low resistance metal layer 52, in which the material of the barrier layer may include titanium (Ti), titanium nitride (TiN), tantalum (Ta) or tantalum nitride (TaN). Furthermore, the material of the low-resistance metal layer 52 may include copper (Cu), aluminum (Al), titanium aluminum (TiAl), cobalt tungsten phosphide (CoWP) or any combination thereof.

It should be noted that as shown in the top view in FIG. 1, the fin-shaped structures 14, 16, 18 are disposed extending along a first direction such as X-direction while each of the gate structures 30, 32, 34, 36, 38, 40, 42, 44 are disposed extending along a second direction (such as Y-direction) orthogonal to the first direction. Preferably, the isolation structures 20 disposed directly under the gate structures 38, 44 are disposed extending along the second direction as the gate structures 38, 44. The isolation structures 22 on the other hand are disposed at the ends of fin-shaped structures 14, 16, 18 and between fin-shaped structures 16 and 18 while surrounding the fin-shaped structures 14, 16, 18.

As shown in FIG. 2, a spacer 56 is formed on sidewalls of each of the gate structures 30, 32, 34, 36, 38, 40, 42, 44, a source region 58 is disposed in the fin-shaped structures 14, 16, 18 adjacent to one side of each of the gate structures 30, 32, 34, a drain region 60 is disposed in the fin-shaped structures 14, 16, 18 adjacent to another side of each of the gate structures 30, 32, 34, selective silicides (not shown) could formed on the surface of the source regions 58 and drain regions 60, a channel region 62 is disposed in the fin-shaped structures 14, 16, 18 directly under each of the gate structures 30, 32, 34, an interlayer dielectric (ILD) layer 64 is disposed on the gate structures 30, 32, 34, 36, 38, 40, 42, 44, and contact plugs 66 are disposed in the ILD layer 64 to electrically connect the source regions 58, drain regions 60, and gate structures 30, 32, 34.

In this embodiment, the spacer 56 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The ILD layer 64 preferably includes oxides such as $SiO_2$, the contact plugs 66 could include barrier layer made of material including but not limited to for example Ti, TiN, Ta, TaN, or combination thereof and low resistance conductive material including but not limited to for example W, Cu, Al, TiAl, CoWP, or combination thereof.

Since the present embodiment pertains to the fabrication of a n-type TFET device, the source region 58 of each of the TFETs 24, 26, 28 preferably includes first type or p-type dopants such as boron and epitaxial layer such silicon germanium (SiGe). The channel region 62 and the drain region 60 on the other hand include second type or n-type dopants such as phosphorus or arsenic, in which the drain regions 60 could also including epitaxial layer such as silicon phosphide (SiP). During operation, the source regions 58 are preferably connected to ground and a positive voltage is applied to the gate structures 30, 32, 34.

In another embodiment such as if a p-type TFET were to be fabricated, the source regions 58 of the device would include n-type dopants while the channel regions 62 and the drain regions 60 would include p-type dopants. During operation of a p-type TFET, the source regions 58 are connected to ground and negative voltage is applied to the gate structures 30, 32, 34.

It should be noted that the isolation structures 20, 22 adjacent to two sides of the TFETs 24, 26, 28 are preferably made of different materials and/or made from different processes. For instance, the isolation structures 20, 22 adjacent to two sides of the TFETs 24, 26, 28 could be made of different materials and different depths or same material and different depths depending on the demand of the product to improve the on current ($I_{on}$) of the device. Taking the TFET 26 shown in FIG. 2 for example, the isolation structure 20 disposed on the left side of source region 58 and the isolation structure 22 disposed on the right side of the drain region 26 are preferably made of different materials, in which the isolation structure 20 is preferably made of a material having tensile stress such as silicon nitride (SiN) while the isolation structure 22 is preferably made of silicon oxide.

Preferably, the isolation structure 20 and the isolation structure 22 are made from different processes, in which the formation of isolation structure 20 could be accomplished by conducting an etching process to divide an original fin-shaped structure into two portions (such as fin-shaped structures 14 and 16) after the original fin-shaped structure is formed on the substrate 12 and then filling a dielectric material between the separated fin-shaped structures 14, 16. The dielectric material filled between the separated fin-shaped structures 14, 16 is also referred to as a single diffusion break (SDB) structure. The isolation structure 22 on the other hand is formed around all of the fin-shaped structures 14, 16, 18 after the fin-shaped structures 14, 16, 18 are divided from the original fin-shaped structure and the isolation structures 22 could be formed before or after the isolation structure 20 is formed.

Viewing from a more detailed perspective, the isolation structure 20 made of silicon nitride having tensile stress preferably includes a bottom portion 68 embedded within the fin-shaped structures 14, 16 and a top portion 70 on the bottom portion 68, in which the width of the top portion 70 is less than the width of the bottom portion 68. The isolation structure 22 made of silicon oxide having no stress at all on the other hand has a completely planar top surface. Moreover, the depth of the isolation structure 20 is greater than the depth of the isolation structure 22 or viewing from another perspective the bottom surface of the isolation structure 20 is lower than the bottom surface of the isolation structure 22.

It should be noted that even though the top surface of the bottom portion 68 of isolation structure 20 is even with the top surface of isolation structure 22 in this embodiment, according to an embodiment of the present invention, the top surface of the bottom portion 68 could also be slightly higher than or slightly lower than the top surface of the isolation structure 22, which are all within the scope of the present invention. Moreover, instead of having the top surface of the top portion 70 of isolation structure 20 to be even with the top surface of the fin-shaped structures 14, 16, according to other embodiments of the present invention, the top surface of the top portion 70 could also be slightly higher than or slightly lower than the top surface of fin-shaped structures 14, 16, which are all within the scope of the present invention.

It should be noted that only a single gate structure 38 is disposed directly on top of the isolation structure 20 while two gate structures 40, 42 are disposed on the isolation structure 22 at the same time, in which two sidewalls of the isolation structure 20 are aligned with two sidewalls of the gate structures 38 atop while only part of the gate structures 40, 42 is disposed on top of the isolation structure 22.

Figure 3:
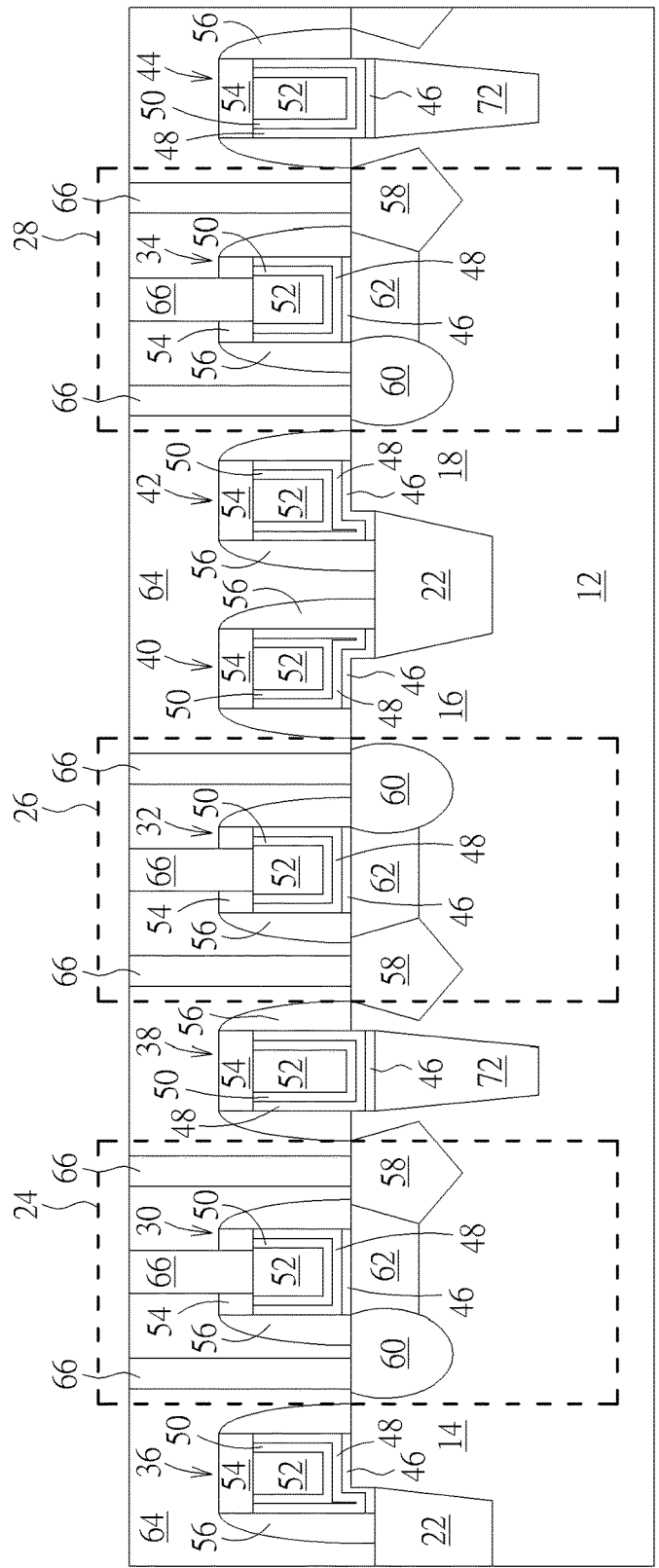
FIG. 3 illustrates a structural view of a TFET according to an embodiment of the present invention.

Referring to FIG. 3, FIG. 3 illustrates a structural view of a TFET according to an embodiment of the present invention. As shown in FIG. 3, in contrast to the isolation structures 20 and 22 adjacent to two sides of the TFET 26 are made of different materials, the isolation structure 72 on the left side of source region 58 of TFET 26 and the isolation structure 22 on the right side of drain region 60 are preferably made of same material such as silicon oxide.

Similar to the isolation structure 20 disclosed in the previous embodiment, the formation of the isolation structures 72 in this embodiment is accomplished by conducting an etching process to divide an original fin-shaped structure into two portions (such as fin-shaped structures 14 and 16) after the original fin-shaped structure is formed on the substrate 12 and then filling a dielectric material between the separated fin-shaped structures 14 and 16. The dielectric material filled between the divided fin-shaped structures 14, 16 then becomes the isolation structure 72, which is also referred to as a SDB structure. In contrast to the isolation structure 20 made of silicon nitride having tensile stress, the dielectric material filled between the fin-shaped structures 14, 16 in this embodiment preferably includes silicon oxide having no stress so that the top surface of the isolation structure 72 reveals a completely planar profile as the top surface of isolation structure 22. Moreover, since the isolation structure 72 is formed by dividing fin-shaped structures and then filling dielectric material between the divided fin-shaped structures, the bottom surface of the isolation structure 72 is preferably lower than the bottom surface of the isolation structure 22.

Moreover, according to other embodiments of the present invention, instead of having the top surface of the isolation structure 72 to be even with the top surface of the isolation structure 22, the top surface of the isolation structure 72 could also be slightly higher than or lower than the top surface of the isolation structure 22, which are all within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A tunnel field effect transistor (TFET), comprising:
   a fin-shaped structure on a substrate;
   a first gate structure on the fin-shaped structure;
   a source region having a first conductive type on one side of the first gate structure;
   a drain region having a second conductive type on another side of the first gate structure;
   a first isolation structure adjacent to the source region, wherein the first isolation structure comprises a single diffusion break (SDB) structure for dividing the fin-shaped structure into a first portion and a second portion; and
   a second isolation structure adjacent to the drain region, wherein the first isolation and the second isolation comprise different material and different depths.

2. The tunnel field effect transistor of claim 1, further comprising a channel region directly under the first gate structure.

3. The tunnel field effect transistor of claim 2, wherein the channel region comprises the second conductive type.

4. The tunnel field effect transistor of claim 1, further comprising a second gate structure on the first isolation structure.

5. The tunnel field effect transistor of claim 1, further comprising a third gate structure on the second isolation structure.

6. The tunnel field effect transistor of claim 1, wherein the first isolation structure comprises a dielectric material having tensile stress.

7. The tunnel field effect transistor of claim 6, wherein the first isolation structure comprises silicon nitride.

8. The tunnel field effect transistor of claim 1, wherein the first isolation structure comprises:
   a bottom portion in the substrate; and
   a top portion on the bottom portion, wherein a width of the top portion is less than a width of the bottom portion.

9. The tunnel field effect transistor of claim 1, wherein the second isolation structure comprises silicon oxide.

10. The tunnel field effect transistor of claim 1, wherein a top surface of the second isolation structure is planar.

11. A tunnel field effect transistor (TFET), comprising:
    a fin-shaped structure on a substrate;
    a first gate structure on the fin-shaped structure;
    a source region having a first conductive type on one side of the first gate structure;
    a drain region having a second conductive type on another side of the first gate structure;
    a first isolation structure adjacent to the source region, wherein the first isolation structure comprises a single diffusion break (SDB) structure for dividing the fin-shaped structure into a first portion and a second portion; and a second isolation structure adjacent to the drain region, wherein the first isolation and the second isolation comprise same materials and different depths.

12. The tunnel field effect transistor of claim 11, further comprising a channel region directly under the first gate structure.

13. The tunnel field effect transistor of claim 12, wherein the channel region comprises the second conductive type.

14. The tunnel field effect transistor of claim 11, further comprising a second gate structure on the first isolation structure.

15. The tunnel field effect transistor of claim 11, further comprising a third gate structure on the second isolation structure.

16. The tunnel field effect transistor of claim 11, wherein the first isolation structure comprises a dielectric material having tensile stress.

17. The tunnel field effect transistor of claim 16, wherein the first isolation structure comprises silicon oxide.

18. The tunnel field effect transistor of claim 17, wherein a top surface the first isolation structure is planar.

19. The tunnel field effect transistor of claim 11, wherein the second isolation structure comprises silicon oxide.

20. The tunnel field effect transistor of claim 19, wherein a top surface of the second isolation structure is planar.

* * * * *